United States Patent [19]

Pruniaux et al.

[11] 3,823,352

[45] July 9, 1974

[54] FIELD EFFECT TRANSISTOR STRUCTURES AND METHODS

[75] Inventors: Bernard Roger Pruniaux, Conflan St. Honorine, France; Terence James Riley, Warren; Robert Morgan Ryder, Summit, both of N.J.; Herbert Atkin Waggener, Allentown, Pa.

[73] Assignee: Bell Telephone Laboratories, Incorporated, Berkeley Heights, N.J.

[22] Filed: Dec. 13, 1972

[21] Appl. No.: 314,785

[52] U.S. Cl. .......................357/23, 29/571, 29/579

[51] Int. Cl. ......................... H01l 11/00, B01j 17/00

[58] Field of Search ............. 29/571, 578, 580, 579; 317/235 B

[56] References Cited

UNITED STATES PATENTS

| | | | |
|---|---|---|---|
| 3,244,555 | 4/1966 | Adam | 29/578 |
| 3,590,471 | 7/1971 | Lepselter | 29/571 |
| 3,761,785 | 9/1973 | Pruniaux | 29/578 |

OTHER PUBLICATIONS

Electronics International, Oct. 13, 1969, pages 207–209, "Japanese Take Two Steps Forward in MOS–Bipolar Compatibility."

Electronics, Feb. 15, 1971, pages 99–104, Couge et al., "Double–Diffusion MOS Transistor Achieves Microwave Gain."

*Primary Examiner*—W. Tupman

*Attorney, Agent, or Firm*—R. B. Anderson

[57] ABSTRACT

A field effect transistor is made in a mesa configuration with the top portion of the mesa being the source region and with the limits of the gate electrode being defined by a shadow mask that overhangs part of the mesa. A drift region layer of moderately high resistivity is included between the transistor channel region and the drain region and constitutes the upper wafer substrate surface from which the mesa extends. A thin implanted layer in the upper surface of the drift region layer limits the extent of the channel in the mesa, and a thick oxide over the drift layer reduces the coupling from the gate electrode to the drift region.

13 Claims, 5 Drawing Figures

FIELD EFFECT TRANSISTOR STRUCTURES AND METHODS

BACKGROUND OF THE INVENTION

This invention relates to field effect transistors, and more particularly, to high frequency insulated gate field effect transistors (IGFETS) and methods for making such IGFETS.

IGFET devices normally comprise source and drain regions on the upper surface of a wafer, interconnected by a channel region through which current is controlled by a gate electrode. The paper "Double-Diffused MOS Transistor Achieves Microwave Gain," T. P. Cauge et al, Electronics, Feb. 15, 1971, pp. 99–104, describes an IGFET device in which a drift region is included between the channel and drain regions. Cauge et al, describe a process including double diffusion for defining both the drift region and an extremely short channel, which is desirable for high frequency operation. Also, by including the drift region, the Cauge et al, device permits higher power gain by permitting higher drain voltages and by giving better-defined current-voltage characteristics.

While the Cauge et al, paper suggests that the gate electrode should overlap the drift region, we have found that it is definitely advantageous to restrict the extent of the gate electrode such that it overlies only the channel; also, other steps should be taken to define the length of the IGFET channel. Specifically, we have found that the electrical channel tends to extend varying distances into the drift region, and that, when this happens, high power and high frequency advantages may be lost, particularly under conditions of high input signals and relatively low drain voltages.

Also of relevance to the present invention is the patent of B. R. Pruniaux, No. 3,761,785, issued Sept. 25, 1973, assigned to Bell Telephone Laboratories, Incorporated, which discloses a "vertical channel" IGFET in which drain and channel layers overlie a source layer and are etched to a mesa configuration. The oxide mask used during etching of the mesa subsequently is used as a precisely registered mask for forming the gate electrode, by metal evaporation, over that part of the mesa surface including the channel layer. In effect, the Pruniaux application describes a self-alignment technique for permitting the formation of a gate electrode to closer tolerances than would otherwise be possible. While the Pruniaux device offers advantages of high frequency operation, it would be desirable to improve it further by reducing the parasitic series resistance of the source region, reducing the drain-to-gate and source-to-gate parasitic capacitances, and reducing the device thermal resistance.

SUMMARY OF THE INVENTION

We have devised a technique for making vertical channel IGFETS in such a way as to attain the advantages of the devices described above, while avoiding many of their drawbacks, and achieving overall superior operating features. The mesa etch technique is used for defining the device, but, rather than arranging the layers in the sequence described in the Pruniaux application, the source layer is the top layer. Masking and etching gives a mesa configuration with an oxide overhang used as a mask for precise registration of an evaporated gate electrode over the channel region. A drift region layer is included between the channel and drain, which gives advantages such as higher power gain and reduced capacitive feedback from drain to gate.

Since the device has a vertical channel, the gate electrode can easily be made to extend over only the channel region, and not over the drift region, even though the channel length is extremely short; in this sense it achieves a definite advantage with respect to the teaching of the Cauge et al, publication. By using the drain layer as the lower layer upon which the other layers are formed by epitaxy, one can make the source layer of an extremely high conductivity to reduce substantially parasitic source resistance. A high conductivity source layer cannot be used in the Pruniaux device because one cannot grow a thin, high quality, lightly doped epitaxial layer on such a highly doped semiconductor. The presence of the drift region not only gives the advantages described in the Cauge et al publication, but it inherently reduces gate-to-drain parasitic capacitance which may be a problem in the Pruniaux device.

By making use of a two-layer mask, as described in the Pruniaux case, one may also deposit with great accuracy a thick oxide layer over the exposed drift layer to give further operating advantages. This mask may also be used to define a thin implanted layer in the upper surface of the drift region to clearly delimit the extent of the channel region during operation, thus avoiding problems inherent in the Cauge et al device. Channel definition can further be enhanced, if desired, by ion implanting a channel region along the mesa surface of the channel layer. This can be done, again with great accuracy, by using as masks the oxide layer overlying the drift layer and the mesa mask overhanging the source layer.

It will be appreciated that advantages of the prior art are combined in such a way as to avoid concomitant disadvantages, thereby to obtain device operation superior to that previously attained. Numerous other objects, features and advantages will be better understood from a consideration of the following detailed description, taken in conjunction with the accompanying drawing.

DRAWING DESCRIPTION

DETAILED DESCRIPTION

Figure 1:
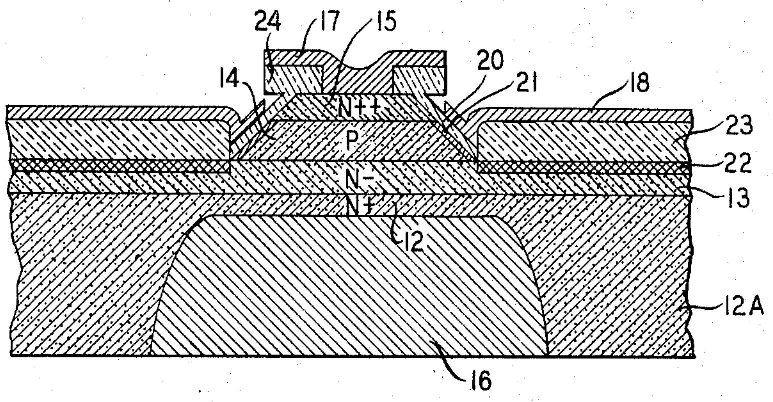
FIG. 1 is a schematic view of an IGFET device illustrating the principles of one embodiment of the invention.

Referring now to FIG. 1, there is shown a cross-sectional view of a field effect transistor, made in accordance with an illustrative embodiment of the invention, comprising a drain layer 12, drift layer 13, channel layer 14 and source layer 15. A drain electrode 16 makes electrical contact to the drain layer, a source contact 17 contacts the source layer, and a gate electrode 18 partially surrounds the channel layer 14 and is insulated from it by an insulative film 20. A channel region 21 is defined by a thin layer of impurities in the channel layer. A thin layer of impurities 22 in the drift layer 13 delimits the extent of the electrical channel in the channel layer and may for convenience be referred to as an "anti-channel." It is to be understood that conductivity types complementary to those shown and described could alternatively be used if so desired.

During operation, a sufficient positive voltage is applied to the drain electrode 16 to deplete of background charge carriers the operative portion of drift layer 13. Further, a sufficient positive voltage is applied to the gate electrode 18 to invert the conductivity of channel region 21 to *n*-type conductivity, thereby to permit electron conduction between the source and drain regions via the drift layer. Modulation of the gate voltage controls this conduction to permit such useful functions as amplification and switching. As mentioned before, the drift region 13 enhances device operation, because, among other reasons, it permits higher power gain both by giving a flatter current-voltage curve in the saturation portion of the curve, and by permitting a higher reverse bias voltage on the drain. It also reduces interelectrode capacitances in a manner consistent with short channel lengths. We have also found that the drift region should be of a low carrier concentration with a conductivity type opposite that of the channel layer in order to provide compensation for the space-charge forces of the current carriers. That is, in its depleted condition, ionized impurities in the drift layer 13 provide electric field compensation for the negative charge on electrons injected from the channel, thereby reducing limitations on the channel current and device power by electron space-charge forces.

Because of the construction of device 11, the channel and the gate electrode 18 may be extremely short, as is required for microwave operation, but nevertheless, the gate electrode is electrically isolated from drift layer 13. A relatively thick oxide layer 23 minimizes further any gate-to-drain capacitance. The precise registration of the gate electrode over the channel is obtained by making use of the techniques described in the aforementioned Pruniaux application. That is, layers 14 and 15 are etched to a mesa configuration using an oxide mask 24 which inherently overhangs the mesa after the etch is completed. Because anisotropic etching undercuts the mask 24 in a highly predictable manner, the mask is precisely oriented with respect to the mesa. Thus, it constitutes a dependable, self-aligned mask for delimiting the extent of the gate electrode 18 as will be explained hereinafter.

In addition to the inclusion of a drift region, device 11 is advantageous over the Pruniaux et al, device in that source 15 is included at the top of the mesa rather than at the mesa base. Since no epitaxial layer need be grown over the source layer 15 during fabrication, the carrier concentration may be made arbitrarily high, whereas, in the Pruniaux et al, device, if the carrier concentration of the source is too high, a thin, high quality, lightly doped epitaxial layer cannot be grown over it as required during device fabrication. Another advantage is that current carrier (electron) flow in device 11 is from the top to the bottom, which inherently reduces the spreading resistance at the interface between the source and channel, as compared with the Pruniaux et al, configuration. Finally, the thermal characteristics of the device are superior to those of the Pruniaux et al, device because drain contact 16 is a relatively massive piece of metal, physically larger than any metal drain contact that could be made on the Pruniaux et al device.

Figure 2A:
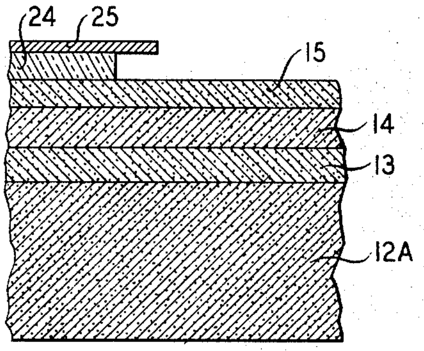
FIGS. 2A through 2C illustrate successive steps in making the IGFET device of FIG. 1, in accordance with an illustrative embodiment of the invention.
Figure 2B:
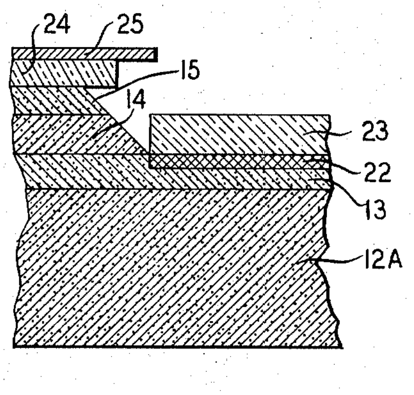
Figure 2C:
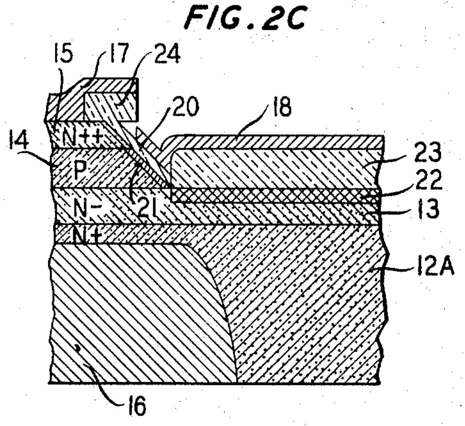

Referring to FIGS. 2A through 2C, consider next the method of fabricating device 11 in FIG. 1. Normally, a relatively large wafer 12A is used upon which a large number of devices are simultaneously fabricated as is conventional in the art. The starting wafer 12A is of $n^+$ conductivity and will eventually constitute the drain layer 12 of each device. Next, the high resistivity drain contact layer 13 is grown by epitaxy to any desired thickness, typically one or two microns. Next, the *p* channel layer 14 is grown, implanted or diffused to a thickness appropriate for microwave frequency operation, as for example one micron. Last, the $n^{++}$ source layer 15 is diffused or implanted into the structure.

The structure is preferably silicon with typical carrier concentrations of the drain, drift, channel and source regions being, respectively, $10^{19}$, $10^{15}$, $10^{17}$, and $10^{21}$ carriers per cubic centimeter. The carrier concentration of the drain region is limited because of the necessity of making an epitaxial growth over it; but, as mentioned before, the carrier concentration of the source layer may be much higher than that of the Pruniaux application because it is the top layer.

A silicon dioxide mask layer 24 and an overlapping silicon nitride layer 25 are formed in the manner described in the aforementioned Pruniaux application. That is, they are made originally to be made coextensive by mask and etch techniques and then exposed to an etchant which selectively etches silicon dioxide as a predictable function of time. After a predetermined time the etchant is removed, leaving the precise desired overhang of the silicon nitride layer 25.

Referring to FIG. 2B, layers 14 and 15 are next anisotropically etched to give a mesa configuration that undercuts silicon dioxide mask layer 24 by a predetermined amount. As described in the Pruniaux application, mask layer 24 may be oriented to give an etch along the (110) crystallographic plane resulting in a mesa sidewall angle with respect both to mask 24 and drain layer 13 of precisely 45 degrees.

Next, anti-channel layer 22 is formed by ion implanting acceptor impurities from a source opposite the silicon nitride mask 25. The mask shields the mesa from the impurities to give precise registration of line 22. Likewise, silicon dioxide layer 23 is formed by evaporation deposition, with mask 25 shielding the mesa surface. Layer 22 may have a *p*-type carrier concentration of $10^{18}$ carriers/cm$^3$ and a thickness of 0.2 microns. Layer 23 may, for example, be 1 micron thick.

Figure 3:
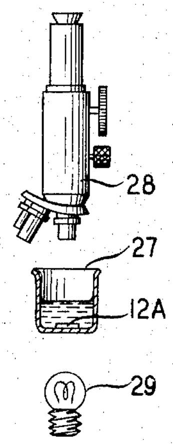
FIG. 3 is a schematic view of apparatus used for part of the processing of the device of FIG. 1.

Referring to FIG. 3 the silicon nitride layer 25 is next dissolved by a selective etch, leaving only the silicon dioxide mask 24 overhanging the mesa. At this stage, mask 24 and layer 23 constitute effective masks for permitting channel layer 21 to be ion implanted into only the channel layer 14. As is known, the formation of a channel layer is optional to the dependable operation of an IGFET and is usually used for reducing the gate voltage needed for surface inversion.

The layer is typically formed by donor impurities of a sufficient density to reduce the conductivity of the *p* channel layer 14 to a value approaching intrinsic conductivity; of course, the closer the channel layer approaches intrinsic conductivity, the smaller the gate voltage required for conductivity inversion. The channel layer 21 of course cooperates with the anti-channel 22 to keep the maximum electrical channel length precisely defined and to prevent an extension of the "pinch off" of the end of the channel. Donor impurities of a concentration of $10^{17}$ per cubic centimeter may typically be implanted to a depth of 0.2 microns.

After the channel implant, the mask 24 is used, as in the Pruniaux application, to make the deposition of evaporated metal forming the gate electrode 18. First, a window is formed in mask 24 by conventional photolithographic etching, and the gate oxide film 20 is formed by conventional oxide growth. Metal is evaporated from a source opposite the mask 24, and that deposited on the top of the mesa constitutes source contact 17, while that deposited on the mesa surface is precisely registered with the device channel region.

The step of implanting layer 21 may occur either before or after the formation of film 20. If preferred prior to oxidation, the oxidation step can conveniently be used to anneal layers 21 and 22. Alternatively, the oxide 20 may be eliminated entirely as would be the case if the device being made were a Schottky barrier junction field effect transistor (J-FET).

At this stage in the processing, numerous mesas have been formed on the surface of a single silicon wafer. Referring to page 1, the wafer thickness is then reduced, as by backlapping, to a thickness of approximately 50 microns. Next, by conventional photolithography, a photoresist mask is formed on the back surface of the wafer which exposes only the regions in which drain contact 16 for each mesa is to be formed.

Referring to FIG. 3, the wafer 12A is then placed in a beaker 27 containing a silicon etchant and is viewed through a microscope 28 as the exposed portions of the wafer are dissolved. The side of the wafer opposite the microscope is illuminated by a source of red light 29. It can be shown that, at a thickness of from 5 to 10 microns, silicon is transparent to red light. Thus, when red light is perceived at the locations of the various mesas, the wafer is removed, at which stage, cavities of an appropriate depth for the drain contacts 16 have been formed in all of the exposed device regions. The photoresist is removed, platinum or palladium silicide is formed on the back of the wafer, and a gold or silver layer is electroplated to a thickness of approximately 75 microns. Finally, the excess metal is lapped to provide the essentially planar back surface shown in FIG. 1. The wafer is scribed and broken to define the various devices each of which contains the relatively massive drain contact 16, to provide effective thermal conduction from the drain region of the device.

From the foregoing, it can be appreciated that a single photolithographic step provides common registration of the implanted channel stop 22, the thick oxide 23, the implanted channel 21 and the gate electrode 18. Registration of these features with predetermined accuracy to tolerances in the micron or even submicron range can be achieved. Any of a number of methods may be used, but normally, particle projection rays must be collimated so as to produce shadowing from the overhanging mask as described before; however, variations in deposition angle may in some cases be desirable.

The short channel length obtainable through the use of the invention theoretically permits device operation in the range of 20 to 40 gigahertz. It can be shown that, with the structure described, the parasitic resistances and capacitances are also sufficiently low to permit 20 gigahertz operation with a 3 db input cutoff or 40 gigahertz with a 3 db output cutoff. Operation at such frequencies, with the reasonably high power gains obtainable, significantly increases the scope of application of field effect transistors.

The foregoing is intended only to be illustrative of the inventive concepts involved. Various other embodiments and modifications may be made by those skilled in the art without departing from the spirit and scope of the invention.

What is claimed is:

1. A method for making field effect transistors comprising the steps of:

forming on a semiconductor wafer surface drain, drift, channel and source layers;

forming a mask layer over the source layer;

shaping, by etching, the channel and source layers to a mesa configuration having tapered sides which are overhung by the mask layer, thereby to expose part of the drift layer;

forming an insulative layer on the upper exposed surface of the drift layer which extends substantially at least to the junction between the drift and channel layers;

and evaporating metal onto the mesa structure and insulative layer while shielding said source layer, thereby to form a gate electrode overlying the channel layer and insulated from the drift layer.

2. The method of claim 1 wherein:

the source, drift and drain regions are formed to be of one conductivity type and the channel region is formed to be of the opposite conductivity type.

3. The method of claim 2 wherein:

the step of forming the mask layer comprises the steps of forming a first mask layer on the upper surface of the source layer, forming a second mask layer on the upper surface of the first mask layer, etching part of the first mask layer such that the second mask layer overhangs the first mask layer;

and the step of forming the insulative layer comprises the step of depositing insulative material on the upper surface of the drift layer from a location opposite the second mask layer such that the second mask layer shields the mesa surface from the deposited insulative material;

and selectively dissolving the second mask layer, thereby leaving the first mask layer which overhangs part of the mesa surface.

4. The method of claim 3 wherein:

the evaporating step takes place after the step of dissolving the second mask layer, and comprises the step of evaporating metal onto the mesa structure from a point opposite the first mask layer such that the overhanging portion of the first mask layer shields the source layer from the vaporized metal.

5. The method of claim 4 further comprising the step of:

forming a thin layer on the upper surface of the drift layer, said thin layer being of a different conductivity type than that of the drift layer.

6. The method of claim 5 wherein:

the step of forming the thin layer comprises the step of projecting material toward the drift layer from a location opposite the second mask layer, such that the second mask layer shields the mesa surface from the projected material.

7. The method of claim 6 further comprising the step of:

ion implanting a channel region in the mesa surface of the channel layer using as an ion mask the first mask layer overhanging the mesa and the insulative layer on the upper surface of the drift layer.

8. The method of claim 7 wherein:

a plurality of field effect transistors are made simultaneously and substantially identically on a single semiconductor wafer; and further comprising the steps of:

masking the wafer so as to expose only limited regions on the wafer back surface opposite each mesa;

etching a cavity in the wafer opposite each mesa by exposing the masked wafer to an etchant;

filling the cavity with metal which constitutes a drain contact;

and separating the individual field effect transistor devices.

9. The method of claim 8 wherein:

the step of etching said cavities comprises the steps of:

illuminating one side of the wafer while the wafer is exposed to the etchant;

observing the other side of the wafer, and removing the wafer from the etchant when light spots representing the cavities are observed.

10. The method of claim 9 wherein:

the wafer is silicon and the light is red light.

11. A method for making a field effect transistor comprising the steps of:

forming a plurality of semiconductor layers on one surface of a semiconductor wafer, the top layer overlying a channel layer;

forming over the top layer first and second mask layers, the second mask layer overlying the first mask layer;

selectively etching part of the first mask layer such that the second mask layer overhangs the first mask layer;

anisotropically mesa etching the top and channel semiconductor layers such that the etch undercuts the second mask, thereby to form a mesa that extends at an angle from a flat semiconductor surface and is overhung by the first and second mask layers;

forming an anti-channel layer in the flat semiconductor surface comprising the step of projecting impurities toward the flat surface from a location opposite the second mask layer, such that the second mask layer shields the mesa surface from the projected impurities;

forming a relatively thick insulative layer over the flat surface comprising the step of depositing insulative material on the flat surface from a location opposite the second mask layer such that the second mask layer shields the mesa surface from the deposited insulative material;

selectively dissolving the second mask layer, thereby leaving the first mask layer which overhangs part of the mesa surface;

forming a channel region in the channel layer comprising the step of projecting the second impurities toward the mesa surface from a location opposite the first mask layer such that the first mask layer and the relatively thick insulative layer expose only the channel layer to the second impurities;

and forming a gate electrode over the channel region comprising the step of evaporating metal onto the mesa structure from a point opposite the first mask layer such that the overhanging portion of the first mask layer shields the top semiconductor layer from the vaporized metal.

12. The method of claim 11 wherein:

the channel layer contains impurities of a first type such as to give the channel layer a first conductivity type;

the step of forming the anti-channel comprises the step of ion implanting impurities of the first type;

and the step of forming the channel region comprises the step of ion implanting second impurities of a second conductivity type.

13. A field effect transistor made by the process of claim 1.

* * * * *